United States Patent [19]
Ohta et al.

[11] Patent Number: 6,087,703
[45] Date of Patent: *Jul. 11, 2000

[54] PHOTODETECTOR AND PHOTODETECTION CIRCUIT

[75] Inventors: Jun Ohta; Masaya Oita; Yoshikazu Nitta; Kunihiko Hara; Takashi Toyoda; Eiichi Funatsu; Yasunari Miyake; Syuichi Tai, all of Amagasaki, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/487,210

[22] Filed: Jun. 7, 1995

[30] Foreign Application Priority Data

Jun. 7, 1994 [JP] Japan .................. P6-125132

[51] Int. Cl.$^7$ .................................... H01L 27/14
[52] U.S. Cl. ................. 257/461; 275/462; 275/469; 275/464; 257/184
[58] Field of Search .................. 257/459, 460, 257/461–464, 184

[56] References Cited

U.S. PATENT DOCUMENTS

| | | |
|---|---|---|
| 3,566,213 | 2/1971 | Kaiser ...................... 257/497 |
| 3,601,668 | 8/1971 | Slaten ...................... 257/464 |
| 4,079,405 | 3/1978 | Ohuchi et al. .............. 257/464 |
| 4,916,305 | 4/1990 | Antell ...................... 257/184 |
| 5,065,207 | 11/1991 | Heinen .................... 257/461 |
| 5,483,341 | 1/1996 | Naganuma ................ 356/345 |

OTHER PUBLICATIONS

"Variable–Sensitivity Photodetector That Uses a Metal–Semiconductor–Metal Structure for Optical Neural Networks", by Y. Nitta et al., *Optics Letters,* vol. 16, No. 8., Apr. 15, 1991.

"Optical Neuro–Devices", by Kazuo Kyuma et al, Optoelectronics—Devices and Technologies, vol. 8, No. 1, Mar., 1993.

"Artificial Retina Devices—Fast Front Ends for Neural Image Processing Systems", by Eberhard Lange et al., 1993 International Joint Conference on Neural Networks.

*Primary Examiner*—Fetsum Abraham
*Attorney, Agent, or Firm*—McDermott, Will & Emery

[57] ABSTRACT

A photodetector device for converting incident light to an electrical signal has two pn junctions or two MOS junctions fabricated in a silicon substrate. Preferably, a control terminal is provided between the two junctions. A photodetection circuit including a photodetector device has a variable sensitivity and can change the polarity of the output of the photodetector device. For example, the photodetection circuits may have a circuit for providing a bias voltage of one of the two polarities to the photodetector device. The photodetection circuit may have a circuit for changing the polarity of the output signal from the photodetector device.

26 Claims, 10 Drawing Sheets

PHOTODETECTOR AND PHOTODETECTION CIRCUIT

BACKGROUND OF THE INVENTION

1. Field of the Invention

The present invention relates to a photodetector device which converts an incident light to an electrical signal according to a control voltage supplied from the external, and a photodetection circuit including a photodetector device.

2. Description of the Prior Art

A photodetector having a metal-semiconductor-metal structure can be used as a photoconductor having variable sensitivity. For example, Y. Nitta, J. Ohta, S. Tai and K. Kyuma, "Variable-sensitivity photodetector that uses a metal-semiconductor-metal structure for optical neural networks" (Optics Letters, 16(8), 611–613 (1991)) discloses a photodetector having two metallic electrodes formed on a gallium arsenide (GaAs) substrate. Schottky contacts are formed at interfaces between them. The output signal of the photodetector is connected to an external circuit of a trans-impedance amplifier. The sensitivity of the photodetector can be controlled by changing a bias voltage applied to the electrodes. The direction of the photocurrent is reversed by changing the polarity of the bias voltage. An effective negative sensitivity can be obtained by changing the direction of photocurrent, or the photocurrent can be suppressed low. If the bias voltage is zero, no photocurrent is taken out due to the Schottky barrier. Dark current is small due to the existence of the Schottky barrier.

A two-dimensional photodetector array comprising a plurality of the photodetectors having a metal-semiconductor-metal structure is used for devices such as an optical neuro-device and an artificial retina device. For example, refer to K. Kyuma, E. Lange and Y. Nitta, Optoelectronics-Devices and Technologies 8(1), 35–52 (1993) and E. Lange, E. Funatsu, K. Hara and K. Kyuma, Proceedings of 1993 International Joint Conference on Neural Networks, pp.801–804 (1993).

However, the sensitivity of the photodetector formed in a GaAs substrate is affected largely by the state at the interfaces or by the crystalline state of the GaAs substrate, so that it has bad reproducibility. Further, a GaAs substrate is expensive than a silicon substrate, and integration techniques on a GaAs substrate are not so mature at present.

On the other hand, a photodetector having a metal-semiconductor-metal structure formed in a silicon substrate has disadvantages of low Schottky barriers, and this makes it difficult to set the zero point and to suppress dark current. Therefore, it is difficult to adopt a silicon substrate for the metal-semiconductor-metal structure.

Further, negative sensitivity is needed for various image processing such as Fourier transformation and contour detection, and a power source of negative voltage is needed to be included in an external circuit in order to obtain the negative sensitivity. However, it is a problem that the power source of negative voltage makes the external circuit complex. It is also a problem that the photodetector itself does not have mechanisms for charge storage and amplification in contrast to an image device such as a charge coupled device, and the sensitivity of the photodetector is much smaller than that of the prior art image devices.

SUMMARY OF THE INVENTION

An object of the present invention is to provide a variable-sensitivity photodetector device which is stable and reproducible.

Another object of the present invention is to provide a photodetection circuit having negative sensitivity without using a power source of negative voltage.

A further object of the present invention is to provide a two-dimensional photodetector array having a high sensitivity.

In one aspect of the invention, a photodetector device which outputs an electric signal in correspondence to incident light, the device comprising: a semiconductor substrate; a first region of a first conduction type formed in said semiconductor substrate; second and third regions formed in said first region, each having a second conduction type opposite to the first conduction type and forming a pn junction with said first region; and first and second electrodes formed on said second and third regions.

A photosensitive device which outputs an electric signal in correspondence to incident light, the device comprising: a semiconductor substrate; a first region formed in said semiconductor substrate; second and third regions formed in said first region, each forming a pn junction with said first region; first and second electrodes formed on said second and third regions; first and second oxide layers formed on said first region between said second and third regions; and first and second metallic layers formed on said first and second oxide layers.

An advantage of a photodetector of the present invention is that the photodetector device is stable and reproducible.

Another advantage of a photodetector device of the present invention is that the photodetector device has low dark current.

A further advantage of a photodetector device of the present invention is that the photodetector device can change the polarity of the photocurrent without using an external component.

An advantage of a photodetection circuit of the present invention is to provide a photodetector device which can change the polarity of the photocurrent without using an external component.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
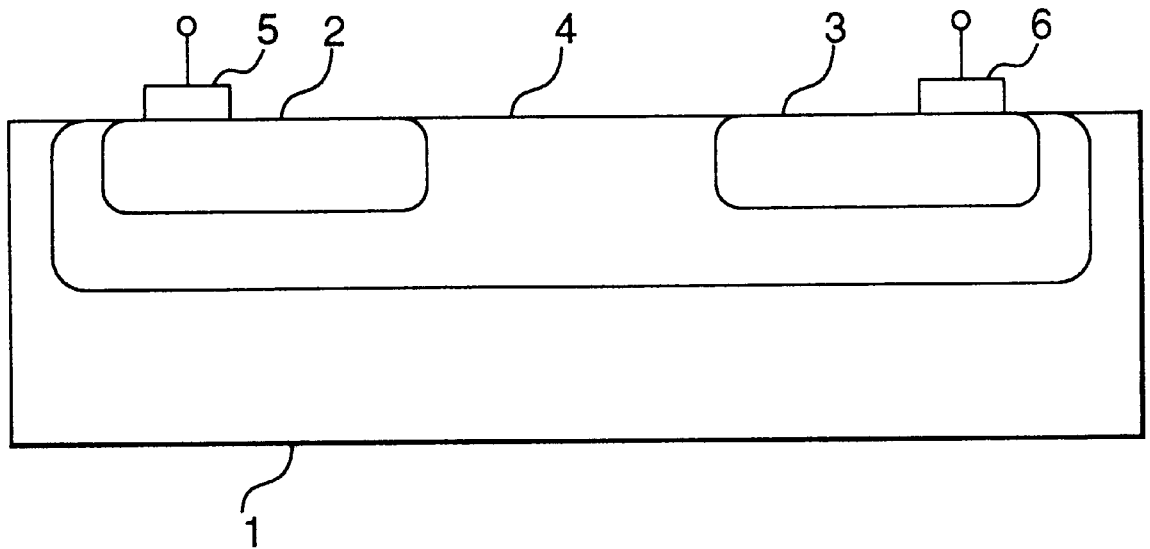
FIG. 1 is a schematic sectional view of a photodetector of a first embodiment of the invention.

Referring now to the drawings, wherein like reference characters designate like or corresponding parts throughout the views, FIG. 1 shows a photodetector of a first embodiment of the invention. An n-type well 4 is formed in a silicon substrate 1, and two p-type regions 2 and 3 are formed in the n-type well 4. Electrodes 5 and 6 are formed on the p-type regions 2 and 3. The photodetector can be fabricated by using a known silicon process.

Next, the operation of the photodetector is explained. The sensitivity of the photodetector can be changed by using energy barriers at the pn junctions in the photodetector. For example, a variable voltage source (not shown) is connected to provide a potential difference (control voltage) between the electrodes 5 and 6. Carriers are generated by radiation of light at the depletion layers at the pn junctions and move according to the control voltage. When the control voltage is positive, electrons move from the pn junction at the p-type region 2 and pass over a potential at the pn junction at the p-type region 3, while when the control voltage is negative, electrons move from the pn junction at the p-type region 3 and pass over a potential at the pn junction at the p-type region 2. Thus, an electrical signal can be taken out from the electrode 6. Because the width of the depletion layer at the pn junctions depends on the control voltage, an amount of the carriers can be changed by the control voltage. Further, because the potential at the pn junctions for carriers to pass over changes with the control voltage, the sensitivity of the output voltage of the photodetector against light can be changed by the control voltage. Further, by providing the two p-type regions near each other, an amplification function can be realized in the device, and the sensitivity can also be changed by a means different from the control voltage. Because the two electrodes 5, 6 are connected to the substrate 1 via the pn junctions, energy barriers thereof are sufficiently high to suppress dark current. Because the p-type regions 2 and 3 are formed symmetrically in the n-type well 4, any direction of the current flowing in the photodetector can be selected, and when the polarity of the output signal is controlled, it is not needed to take the direction of the current into account.

Figure 2:
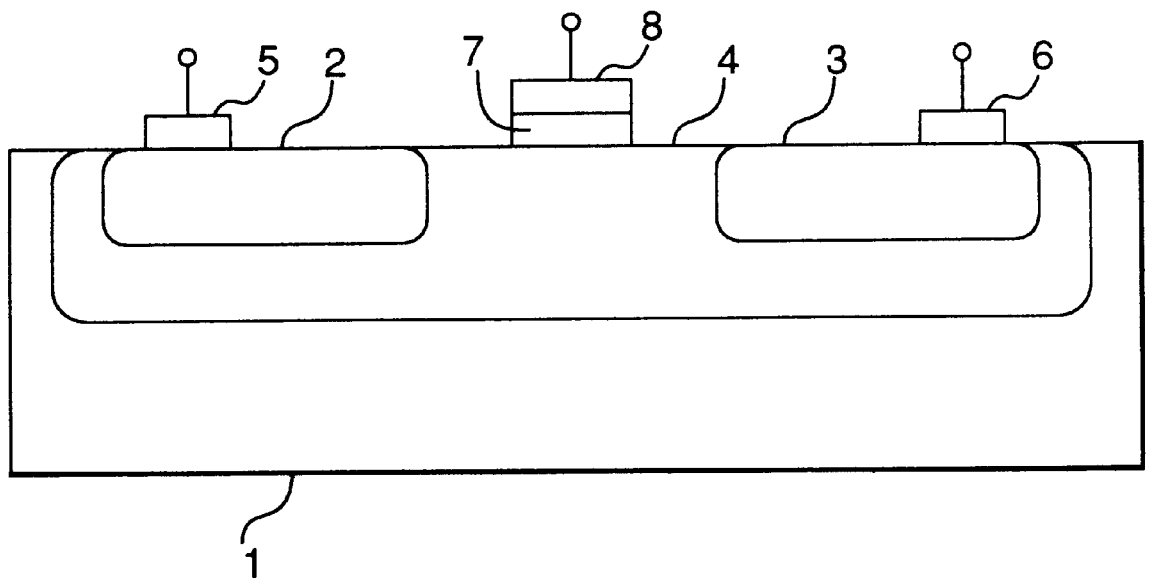
FIG. 2 is a schematic sectional view of a photodetector of a second embodiment of the invention.

FIG. 2 shows a photodetector of a second embodiment of the invention. The photodetect is the same as that shown in FIG. 1 except that an oxide film gate comprising an oxide film 7 and an electrically conducting layer 8 is formed on the n-well at the center between the two p-type regions 2 and 3.

Next, the operation of the photodetector is explained. The operation is similar mainly to that of the photodetector shown in FIG. 1, but another variable voltage source (not shown) is connected to the oxide film gate to control a second control voltage, as well as the variable voltage source (not shown) connected to the electrodes 5 and 6. If no second control voltage is applied to the oxide film gate 7, 8, carriers generated by radiation of light move according to a first control voltage provided at the electrodes 5, 6, as in the photodetector shown in FIG. 1, and an electrical signal can be taken out from the electrodes 5 and 6.

Further, a second control voltage applied to the oxide film gate 7, 8 controls the width of the depletion layer and the potential at the pn junctions. Then, the sensitivity of the output signal against light can be controlled better. That is, by applying a second control voltage to the oxide film gate 7, 8, a depletion layer is formed just below the gate, and carriers generated in the depletion layer are used to increase or decrease a flow of carries between the two p-type regions 2 and 3. Thus, the sensitivity can be controlled by the oxide film gate 7, 8. In other words, the sensitivity of the electrical signal taken from the electrodes 5, 6 can be controlled at a high precision by using a means 7, 8 different from the first control voltage applied to the electrode 5. Therefore, though the silicon substrate 1 is used for the photodetector, the sensitivity of the photoconductor is sufficiently high, and the photoconductor device with pn junctions provided in the silicon substrate can be used practically.

Figure 3:
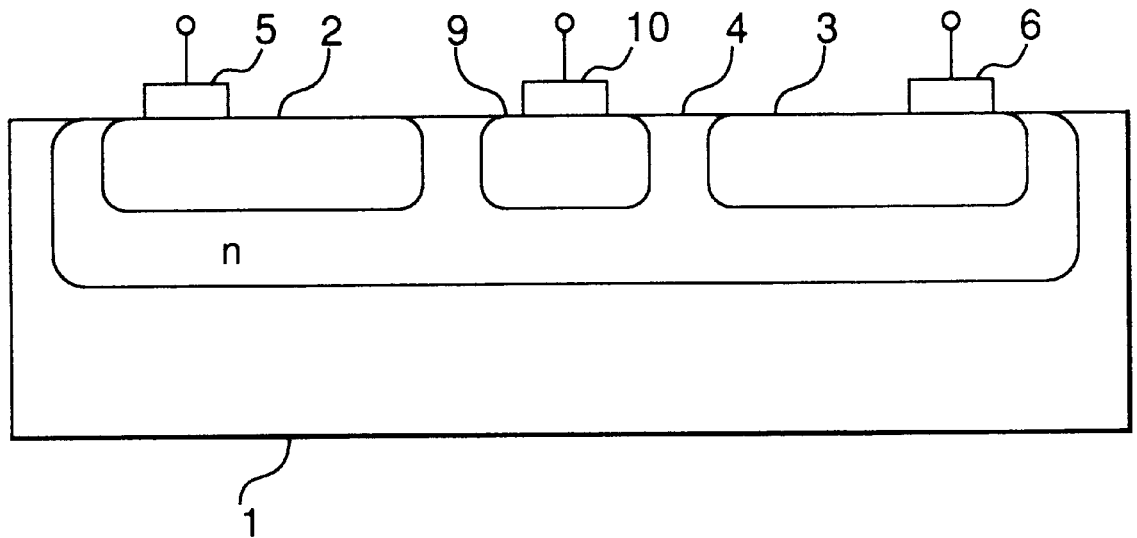
FIG. 3 is a schematic sectional view of a photodetector of a third embodiment of the invention.

FIG. 3 shows a photodetector of a third embodiment of the invention. The photodetector is the same as that shown in FIG. 1 except that a third p-type region 9 is formed in the n-type well 4 at the center between the two pn junctions at the p-type regions 2 and 3 to form a third pn junction and that a third electrode 10 is formed on the p-type region 9. That is, the photodetector has three pn junctions. Another variable voltage source (not shown) is connected to the third electrode 10. By applying a control voltage to the third electrode 10, a depletion layer is formed just below the gate, and carriers generated in the depletion layer are used to increase or decrease a flow of carriers between the two p-type regions 2 and 3. Thus, the sensitivity can be controlled by the third electrode 10 at a high precision by a means different from the control voltage applied to the electrode 5. Therefore, though the silicon substrate 1 is used, the sensitivity of the photoconductor is sufficiently high, and a photoconductor device with pn junctions provided in a silicon substrate can be used practically.

Figure 4:
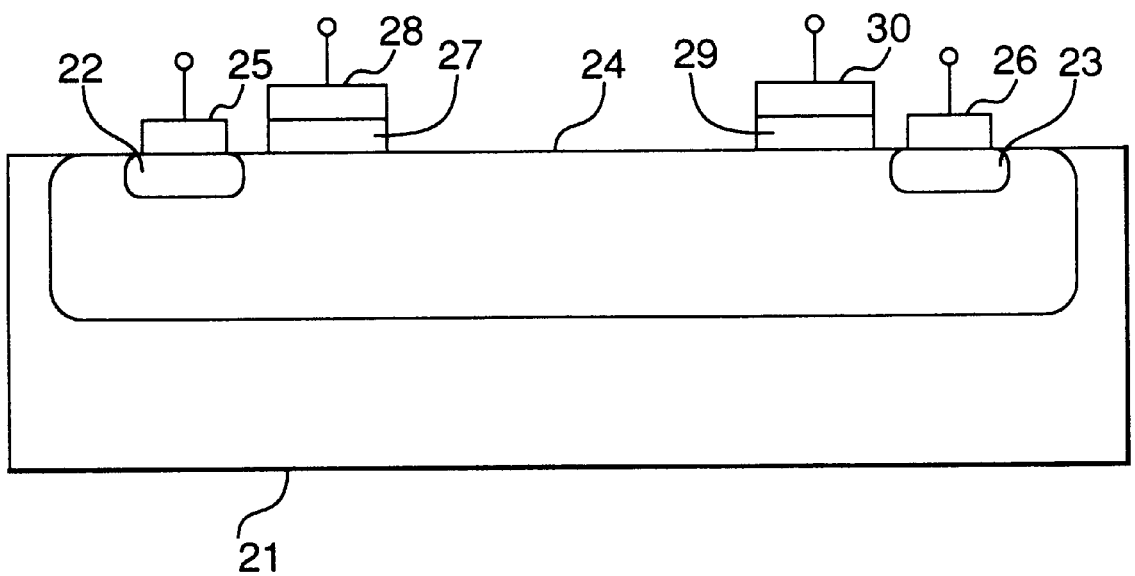
FIG. 4 is a schematic sectional view of a photodetector of a fourth embodiment of the invention.

FIG. 4 shows a photodetector of a fourth embodiment of the invention. An n-type well 24 is formed in a silicon substrate 21. Two n$^+$-type regions 22 and 23 are formed in the n-type well 24 near a boundary thereof with the substrate 21, and electrodes 23 and 26 are formed on the n$^+$-type regions 22 and 23. Further, a first gate comprising an oxide film 27 and an electrically conducting layer 28 and a second gate comprising an oxide film 29 and an electrically conducting layer 30 are formed on the n-well 24 near the two n$^+$-type regions 22 and 23 at the side of the center of the n-type well 24. Thus, two metal-oxide-semiconductor (MOS) junctions are formed in the silicon substrate 21, and depletion layers can be formed just below the oxide films 27, 29.

Next, the operation of the photodetector is explained. A variable voltage source (not shown) is connected to the electrodes 25 and 26, while another variable voltage source (not shown) is connected to the electrically conducting layers 28 and 30 which act a role of electrodes of the MOS junctions to supply a voltage. By applying a potential difference to the MOS junctions, a depletion layer is formed just below the MOS junctions on radiation, and carriers generated in the depletion layers are moved to the $n^+$-type region 22 or 23 according to the potential difference (control voltage) and another potential difference between the electrodes 25 and 26 set appropriately in correspondence to the control voltage. That is, the carriers move between the $n^+$-type regions 22 and 23, and an electrical signal can be taken out from the electrodes 25, 26. Because the width of the depletion layers just below the oxide films 27, 29 are changed by the applied control voltage, an amount of carriers generated on radiation of light is also changed so that the sensitivity of the output signal against light can be controlled.

Figure 5:
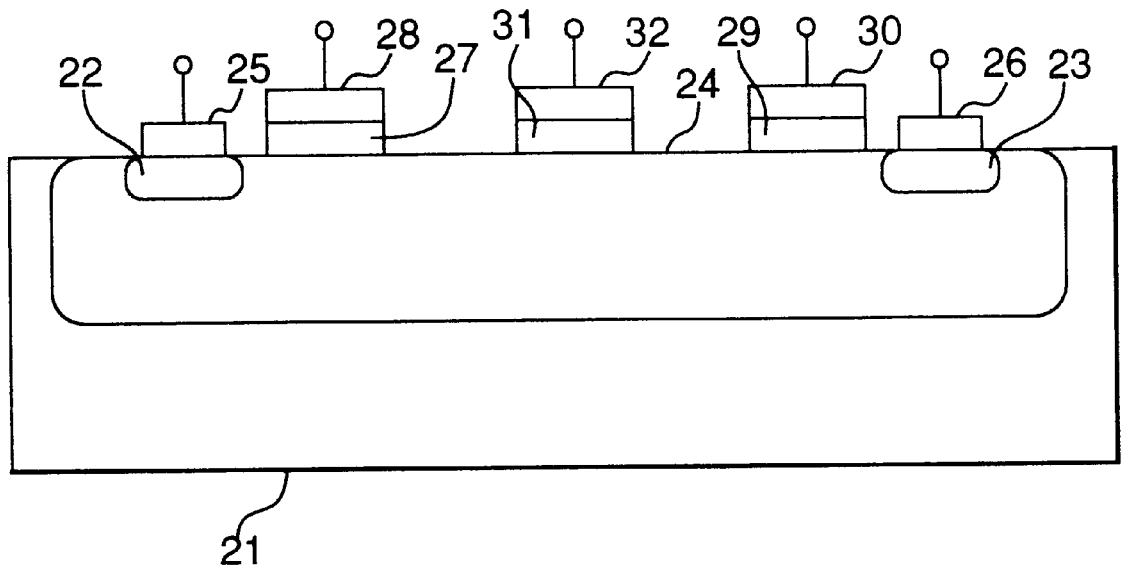
FIG. 5 is a schematic sectional view of a photodetector of a fifth embodiment of the invention.

FIG. 5 shows a photodetector of a fifth embodiment of the invention. The photodetector is the same as that shown in FIG. 4 except that an oxide film gate comprising an oxide film 31 and an electrically conducting layer 32 is formed on the n-well 24 at the center between the two MOS junctions. By connecting a third variable voltage source (not shown) to the conducting layer 32, a depletion layer can be formed just below the oxide film 31. Then, carriers generated in the depletion layer are used to increase or decrease a flow of carriers between the two $n^+$-type regions 22 and 23, and the sensitivity of the output signal can be controlled at a high precision by a means 31, 32 different from the control voltage applied to the electrode 5. Thus, though the silicon substrate 21 is used, the sensitivity of the photoconductor is sufficiently high, and a photoconductor device using a silicon substrate can be used practically.

Figure 6:
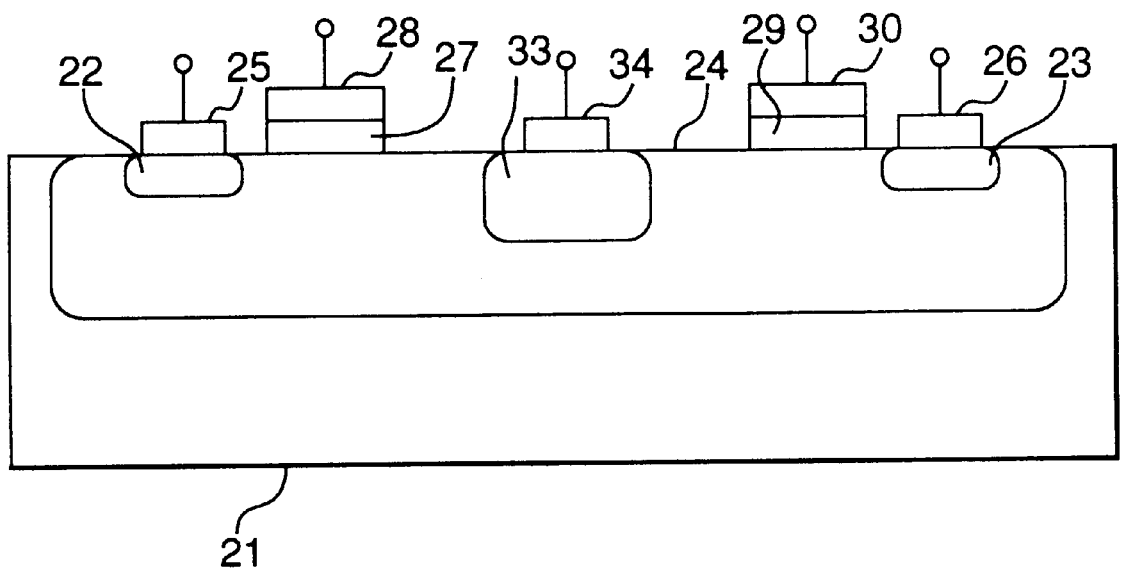
FIG. 6 is a schematic sectional view of a photodetector of a sixth embodiment of the invention.

FIG. 6 shows a photodetector of a sixth embodiment of the invention. The photodetector is the same as that shown in FIG. 4 except that a p-type region 33 is formed in the n-type well 24 at the center between the two $n^+$-type regions 22 and 23 to form a pn junction and that an electrode 34 is formed on the p-type region 33. That is, the photodetector has two MOS junctions and one pn junction. A further variable voltage source (not shown) can be connected to the third electrode 34. By applying the voltage to the electrode 34, an amplification factor is controlled by the pn junction, and the sensitivity of the output signal against light can be changed. Then, though the silicon substrate 21 is used, the sensitivity of the photoconductor is sufficiently high, and a photoconductor device with use of a silicon substrate can be used practically.

In the above-mentioned photodetectors, barriers due to pn junctions are used in contrast to the Schottky barriers of the prior art MSM structure in the GaAs substrate. Thus, the dark current can be suppressed, while the sensitivity of the output signal against light is high and can be varied.

In the above-mentioned embodiments, for example, two p-type regions are formed in a n-type well. However, the conduction types can be reversed. That is, for example, two n-type regions are formed in a p-type well. The structures of the embodiments are advantageous for a silicon substrate having a small band gap. However, the sensitivity can also be controlled well for other materials such as a III-V compound semiconductor, a II-V compound semiconductor, germanium or a combination thereof with silicon.

Figure 7:
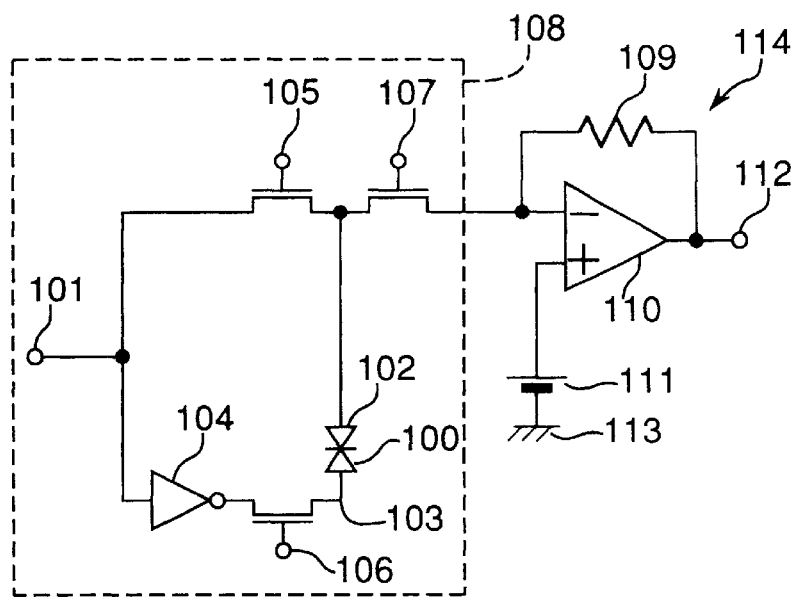
FIG. 7 is a circuit diagram of a photodetection circuit of a seventh embodiment of the invention.

Next, photodetection circuits using the above-mentioned photodetectors are explained. FIG. 7 shows a photodetection circuit 108 of a seventh embodiment of the invention. Reference numeral 100 denotes a variable-sensitivity photodetector of one of the second, third, fifth and sixth embodiments explained above, having a control means to control the sensitivity. Reference numeral 101 denotes a terminal for applying a control voltage to a control means of the photodetector 101 to control the sensitivity of the photodetector. For example, the control means corresponds to the gate 7, 8 of the photoconductor of the second embodiment, to the gate 10 of that of the third embodiment, to the gate 31, 32 of that of the fifth embodiment and to the gate 34 of the sixth embodiment. Reference numerals 102 and 103 denote terminals connected to electrodes of the photodetector 100. For example, the terminals 102 and 103 correspond to terminals connected to the electrodes 5 and 6 of the photodetectors shown in FIGS. 2 and 3, and to the electrodes 25 and 26 of the photoconductors shown in FIGS. 5 and 6. The terminal 101 is connected through an n-channel metal-oxide semiconductor (nMOS) transistor 105 as a switching element to the terminal 102 of the photoconductor 100, and the terminal 102 is connected via another nMOS transistor 107 as a switching element to an external circuit 114. The terminal 101 is also connected to an invertor 104, which is connected to a third nMOS transistor 106 as a switching element to the terminal 103 of the photoconductor 100.

The output signal of the photodetection circuit 108 is connected to—input terminal of an operational amplifier 110. A feedback resistance 109 is connected between the– terminal and an output terminal of the amplifier 110, and a bias voltage 113 is connected between+terminal of the operational amplifier 110 and the ground 113.

Next, an operation of the photodetection circuit is explained. First, the nMOS transistors 105 and 106 are set as on state, while the nMOS transistor 107 is set as off state. Then, the photodetector 100 is biased by the bias terminal 101. A voltage at the bias terminal 101 is directly applied to the terminal 102, while the voltage is inverted by the invertor 104 and applied to the other terminal 103. That is, if the bias voltage is $V_{dd}$ (H level), 0 volt (L level) is applied to the terminal 103, while if the bias voltage is 0 Volt (L level), $V_{dd}$ (H level) is applied to the terminal 103. Therefore, though a voltage of amplitude $V_{dd}$ is always applied between the terminals 102 and 102, the sign of the voltage depends on the input voltage level (H or L) at the bias terminal 101. By turning off the nMOS transistors 105, 106 and 107, the photodetector 100 is isolated.

Then, when light is incident on the photodetector 100, photocarriers are generated inside the photodetector 100 and decrease the bias voltage. After a particular time elapses, the transistor 107 is turned on, to provide the carries accumulated in the photodetector 100 to the external operational amplifier 110. By setting the bias voltage 111 as about a half of $V_{dd}$ applied at the non-inverting terminal, the polarity of the current is controlled. After the carriers are discharged, the transistor 107 is turned off again, while the transistors 105 and 106 are turned on to set the bias to the photodetector 100.

In the circuit explained above, the output voltage is controlled by the bias voltage, or the polarity of the sensitivity can be set as plus or minus by the bias terminal 101 without using a power source of negative voltage. Therefore, the polarity and the sensitivity can be controlled before supplying a signal to the external circuit 114, by using the invertor 104. If accumulation time becomes long by controlling the switching transistors 105, 106 and 107, the sensitivity is increased due to accumulation effect, or the sensitivity can be varied. On the other hand, the sensitivity can also be varied by changing the value of $V_{dd}$, as in a prior art photodetector. Further, it is possible that signals subjected to a desired processing can be obtained in the photodetection circuit, and picture processing at a later stage can be processed at a high speed.

In the above-mentioned embodiment, nMOS transistors are used as the switching elements 105–107. However, other elements such as pMOS transistors, analog switches, bipolar transistors, junction transistors, metal-semiconductor-contact type transistors or static induction transistors may also be used similarly.

Figure 8:
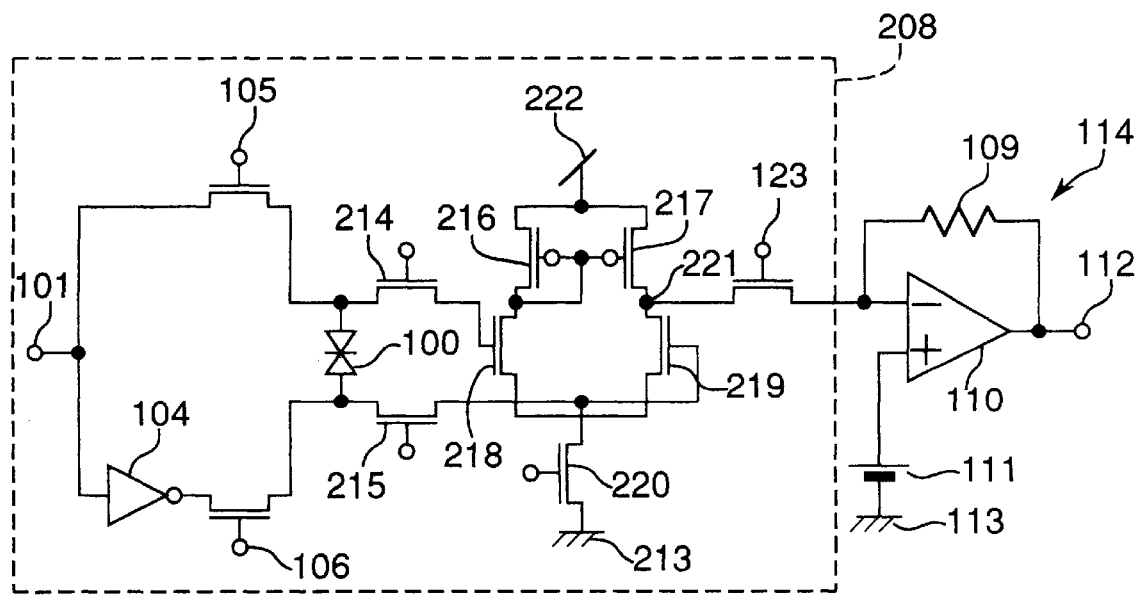
FIG. 8 is a circuit diagram of a photodetection circuit of an eighth embodiment of the invention.

FIG. 8 shows a photodetection circuit 208 of an eighth embodiment of the invention. The circuit 208 differs from that 108 shown in FIG. 7 in that a differential amplifier circuit is provided between the photodetector 100 and an external circuit 114. That is, two terminals of the photodetector 100 are connected via nMOS transistors 214 and 215 as switching transistors to non-inverting and inverting gates of nMOS transistors 218 and 219. The nMOS transistors 218 and 219 are connected between pMOS transistors 216 and 217 for current mirror, connected commonly to a source voltage 222, and an nMOS transistor 220 commonly for controlling bias current which is connected to the ground 113. The output voltage of the nMOS transistor 218 is connected to gates of the pMOS transistors 216 and 217, while the output voltage of the NMOS transistor 219 or of the differential amplifier is connected via an NMOS transistor 223 to an external circuit 114. Therefore, the output signal is controlled by the differential amplifier as well as the invertor 104.

Next, the operation of the circuit 208 is explained. The bias control of the photodetector 100 is the same as that of the photodetection circuit 108 of the eighth embodiment. The output signal of the photodetector 100 is supplied via the switching transistors 214 and 215 to the gates of the transistors 218 and 219 as non-inverting and inverting input voltage of the differential amplifier. A current mirror circuit comprising the transistors 216 and 217 generates a current in correspondence to a difference between the non-inverting and inverting input voltages. The transistor 220 for bias current can control the whole current. Thus, the output voltage of the photodetector 100 is amplified to improve S/N ratio. The output current is supplied by the switching transistor 223 to the external circuit 114. The output circuit shown in FIG. 8 is the same as that shown in FIG. 7. Thus, the sensitivity and the polarity can be controlled.

In the above-mentioned embodiment, nMOS transistors are used as the switching elements 105, 106, 214, 215 and 223. However, other elements such as analog switches, bipolar transistors, junction transistors, metal-semiconductor-contact type transistors or static induction transistors may also be used similarly.

In the above-mentioned embodiment, nMOS and pMOS transistors are used in the differential amplifier. However, pMOS and nMOS transistors can be used for the nMOS and pMOS transistors.

Figure 9:
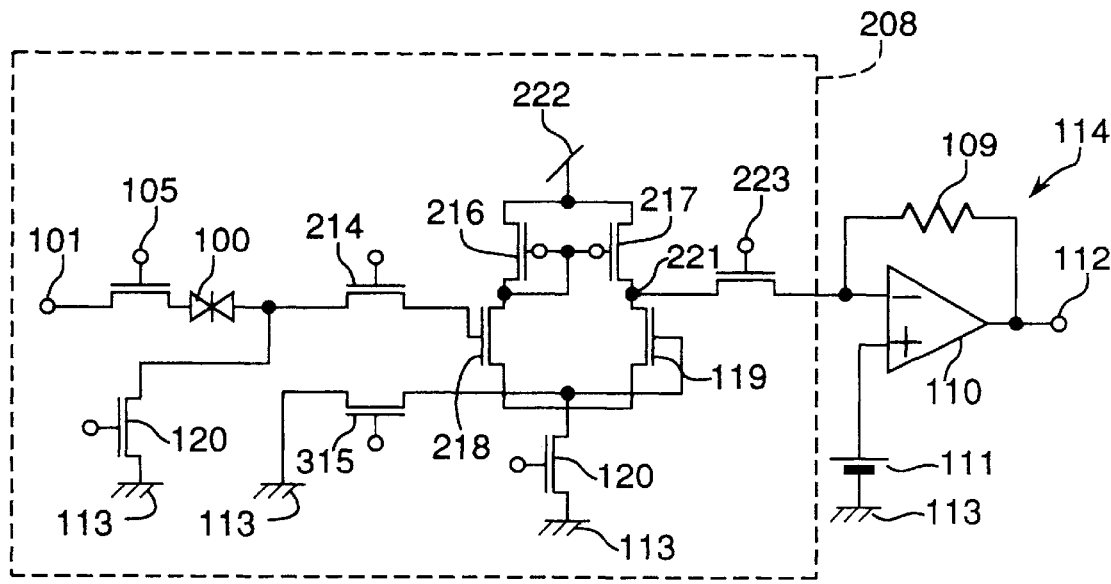
FIG. 9 is a circuit diagram of a photodetection circuit of a ninth embodiment of the invention.

FIG. 9 shows a photodetection circuit 308 of a ninth embodiment of the invention. The circuit 308 does not use the invertor 104 of the circuits shown in FIGS. 7 and 8, but it used the differential amplifier. The circuit 308 has a transistor 339 for reset for the photodetector 100 to set the control voltage. That is, a control voltage provided at the terminal 101 and the ground voltage 113 are connected via nMOS transistors 305 and 339 as switching transistors to two terminals of the photodetector 100. The terminal of the photodetector 100 connected to the switching transistor 339 is also connected via an nMOS transistor 314 as a switching transistor to the gate of the nMOS transistor 218 for non-inverting input. On the other hand, the gate of the nMOS transistor 219 for inverting input is connected via an nMOS transistor 315 as a switching transistor to the ground 113.

In this circuit 308, the differential amplifier which is used to vary the sensitivity. The polarity cannot be controlled by the photodetection circuit 308, but it can be controlled by the control voltage $V_{dd}$ applied to the terminal 101 and the bias voltage 111 for the amplifier 110 in the external circuit 114. The polarity can be controlled by adding to the circuit 308 a circuit for controlling the input polarity from the photodetector 100 to the transistors 218 and 219 in the differential amplifier.

Figure 10:
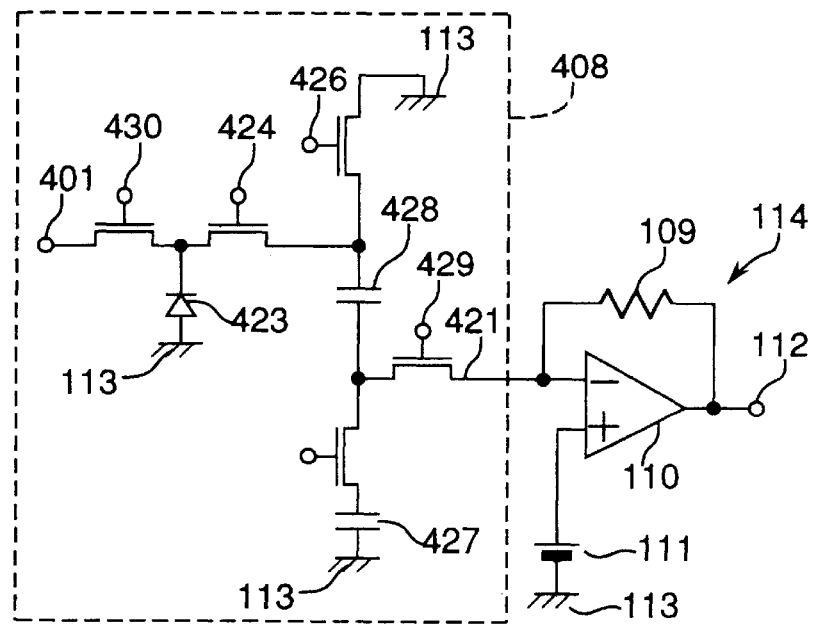
FIG. 10 is a circuit diagram of a photodetection circuit of an tenth embodiment of the invention.

FIG. 10 shows a photodetection circuit 408 of a tenth embodiment of the invention. The circuit 408 has a photodetector 423 having an ordinary pn junction formed in a silicon substrate. A control voltage provided at the terminal 401 and the ground voltage 113 are connected via an nMOS transistor 430 as a switching transistor and directly to the photodetector 423, respectively. The output voltage of the photodetector 423 is connected via an nMOS transistor 414 as a switching transistor to a terminal of a capacitor 428. The terminal of the capacitor 428 is connected via an nMOS transistor 426 as a switching transistor to the ground 113, while the other terminal of the capacitor 428 is connected to an nMOS transistor 425 and another capacitor 427 to the ground 113. The other terminal of the capacitor 428 is further connected via an nMOS transistor 429 as a switching transistor to the external circuit 114.

Next, the operation of the photodetection circuit 408 is explained. When the transistor 430 is turned on and the transistor 424 is turned off, the photodetector 423 is biased through the bias terminal 101. Next, when the transistor 424 is turned on, the voltage between the photodetector 423 is discharged. At this time, the charges are transferred to one of the capacitors 427 and 428 by turning on one of the transistors 425 and 426. For example, when the transistor 425 is turned off and the transistor 426 is turned on, the charges are stored in the capacitor 128. Next, when the transistor 429 is turned on, the current flows to the operational amplifier 110 by changing the current flow direction from the photodetector 423 if the bias voltage 111 of the operational amplifier 110 is smaller than $V_{dd}$. When the transistor 425 is turned on and the transistor 426 is turned off, the charges are stored through the capacitor 428 in the capacitor 427. Next, when the transistor 429 is turned on, the current flows to the operational amplifier 110 without changing the current direction if the bias voltage 111 of the operational amplifier 110 is smaller than $V_{dd}$. The detection by the external circuit 114 is the same as in the seventh embodiment.

Therefore, the polarity of the current can be controlled by selecting the capacitor 427, 428 for storing the charges. The sensitivity can be varied by controlling the time for the storage time to the capacitor, or a time when the transistor 125 or 126 is turned on.

In the above-mentioned embodiment, nMOS transistors are used as the switching elements 424–426, 430 and 431. However, other elements such as pMOS transistors, analog switches, bipolar transistors, junction transistors, metal-semiconductor-contact type transistors or static induction transistors may also be used similarly.

Figure 11:
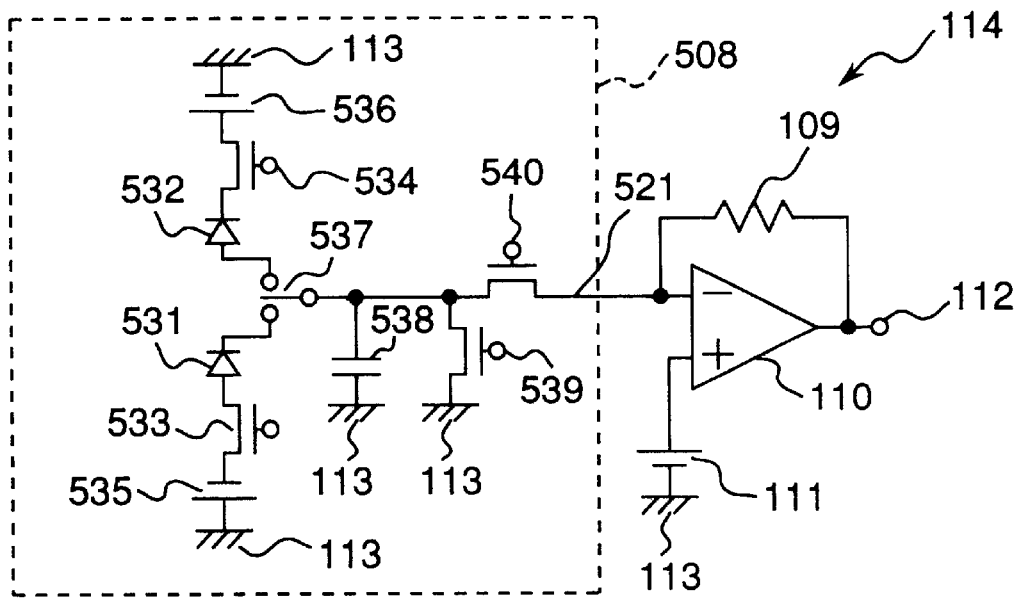
FIG. 11 is a circuit diagram of a photodetection circuit of an eleventh embodiment of the invention.

FIG. 11 shows a photodetection circuit 508 of an eleventh embodiment of the invention. The circuit 508 has photodetectors 531 and 532 having an ordinary pn junction formed in a silicon substrate. The two photodetectors 531 and 532 are connected in series via switch 537, while they are biased by the bias voltage sources 435 and 436 to the ground. The switch 537 is connected to the capacitor 538 for storing the charges accumulated by the photodetector 531 or 532. An nMOS transistor 539 is connected in parallel to the capacitor 538 for reset. The charges in the capacitor 538 are supplied via an nMOS transistor as a switching transistor to the external circuit 114.

Next, the operation of the photodetection circuit 508 is explained. The photodetectors 531 and 532 are biased by the bias voltage sources 535 and 536. Because the photodetectors 531 and 532 are biased in reverse direction to each other, the voltages thereof applied to the switch 537 have opposite signs to each other. After the photodetectors 531 and 532 are biased, the switch transistors 533 and 534 are turned off. The bias voltage of the photodetector 531, 532 decreases when it is irradiated by a light. Next, the switch 537 connects the capacitor 538 to the photodetector 531 or 532. If the switch 537 connects the capacitor 538 to the photodetector 531, the current flows along a direction to flow to the photodetector 531, while if the switch 537 connects the capacitor 538 to the photodetector 532, the current flows along a direction to flow from the photodetector 532. At this time, by turning the transistors 539 and 540 off, the capacitor 538 is charged by the charges accumulated in the photodetector 531 or 532. Finally, by turning the transistor 540 on, an output current can be taken out to the output terminal 521 of the photodetection circuit 508.

In the circuit 508, the polarity can be controlled by selecting the photodetector 531 or 532. The sensitivity is varied by a time for accumulating charges in the capacitor 538.

Figure 12:
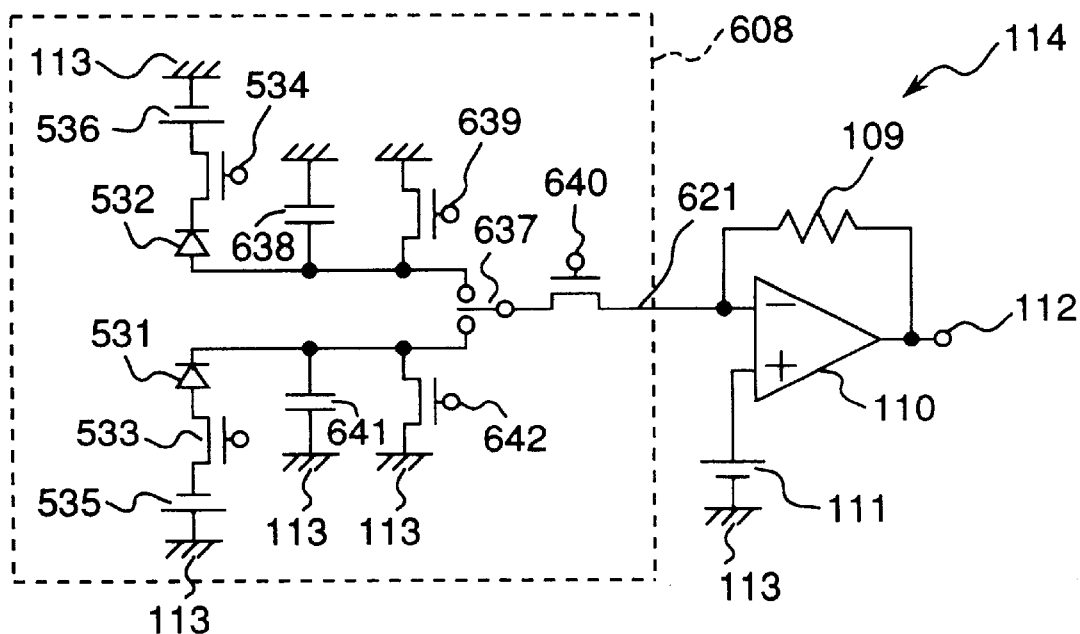
FIG. 12 is a circuit diagram of a photodetection circuit of an twelfth embodiment of the invention.

FIG. 12 shows a photodetection circuit 608 of a twelfth embodiment of the invention. The circuit 608 is similar to the circuit 508 except that two capacitors 638 and 640 are provided. The two photodetectors 531 and 532 are connected in series via a switch 637. The output of the photodetector 531 is connected to the capacitor 637 and an input terminal of the switch 637, while that of the photodetector 532 is connected to the capacitor 641 and the other input terminal of the switch 637. Switching transistors 638 and 642 or nMOS transistors are connected in parallel to the capacitors 638 and 641 for reset. The charges in the capacitor 638 or 641 are supplied via the switch 637 and the switching transistor 640 to the external circuit 114.

Though the photodetection circuit 608 has a complicated circuit, the accumulation time can be controlled better, and it is also possible to read two accumulated data.

In the above-mentioned photodetection circuits 508 and 608, nMOS transistors are used as the switching elements 533, 534, 539, 540, 639, 640 and 642. However, other elements such as pMOS transistors, analog switches, bipolar transistors, junction transistors, metal-semiconductor-contact type transistors or static induction transistors may also be used similarly.

In the above-mentioned photodetection circuits 508 and 608, photodetectors 531 and 532 are pn junction diodes. However, they may be replaced by photodetectors comprising a MOS capacitor, Schottky diodes, amorphous materials, photoconducting materials, thermoelectric materials, or quantum well levels, or a combination thereof.

Figure 13:
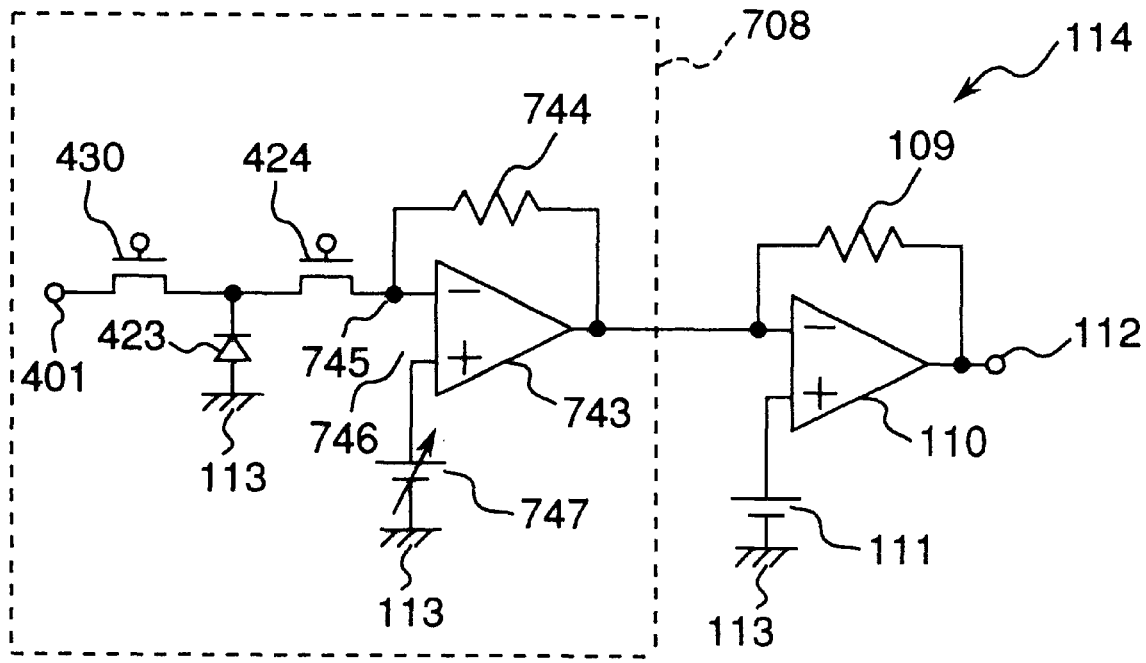
FIG. 13 is a circuit diagram of a photodetection circuit of a thirteenth embodiment of the invention.

FIG. 13 shows a photodetection circuit 708 of a thirteenth embodiment of the invention. The circuit 708 is different from the circuit 408 shown in FIG. 10 in a point that an operational amplifier 743 is provided for controlling the polarity of a current. That is, the current from the photodetector 423 flows through an nMOS transistor as a switching transistor to an inverting input terminal 745 of the operational amplifier 743 and it flows further through a feedback resistor 744 to an output terminal of the amplifier 743. On the other hand, a variable bias voltage source 743 is connected to a non-inverting input terminal 746 of the operational amplifier 743. The output terminal of the amplifier 743 is connected to the external circuit 114.

Next, the operation of the photodetection circuit 708 is explained. A voltage is applied from the bias terminal 410 to the photodetector 423 by turning on the switching transistor 430, while turning off the switching transistor 424. Next, charges are accumulated by radiation while turning off the transistors 430 and 424. After the charge accumulation is over, the transistor 524 is turned on, and an accumulation current can flow to or from the operational amplifier 743 of trans-impedance type. By controlling the variable voltage source 747 or by providing a bias voltage smaller than a voltage at the inverting input terminal 745, the current flows to the operational amplifier 743 from the external circuit 114, while by controlling the variable voltage source 747 or by providing a bias voltage larger than a voltage at the inverting input terminal 745, the current flows from the operational amplifier 743 to the external circuit 114. Therefore, the polarity of the current flowing from the output terminal of the amplifier can be controlled.

Figure 14:
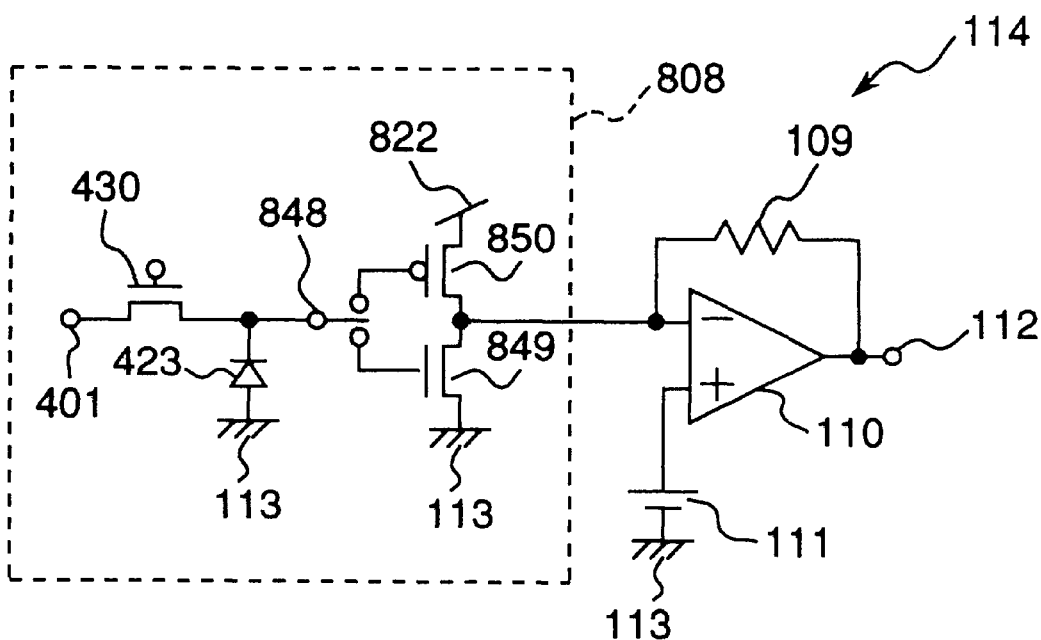
FIG. 14 is a circuit diagram of a photodetection circuit of an fourteenth embodiment of the invention.

FIG. 14 shows a photodetection circuit 808 of a fourteenth embodiment of the invention. The photodetector 423 is biased through the switching transistor by the bias terminal 401, while it is connected through a tri-state switch 848 to two gates of an nMOS transistor 849 and a pMOS transistor 850 which are connected in series between the power supply source 822 and the ground 113. An output terminal 821 between the nMOS and pMOS transistors 849 and 850 is connected to the external circuit 114.

Next, the operation of the photodetection circuit 808 is explained. By turning on the switching transistor 430, the photodetector 423 is biased through the bias terminal 401. Next, by turning off the switching transistor 430, charges accumulated by radiation in the photodetector 423 are input through the switch 848 to one of the gates 849 and 850. Each gate is biased according the an amount of the charges for a current to flow through the external circuit 114. If the switch 848 selects the gate 850 of pMOS transistor, the current flows out, while if the switch 848 selects the gate 849 of nMOS transistor, the current flows out. Therefore, the polarity of the current can be controlled.

In the above-mentioned photodetection circuit 808, MOS transistors are used as the switching elements 849, 850. However, other elements such as bipolar transistors, junction transistors, metal-semiconductor-contact type transistors or static induction transistors may also be used similarly.

Figure 15:
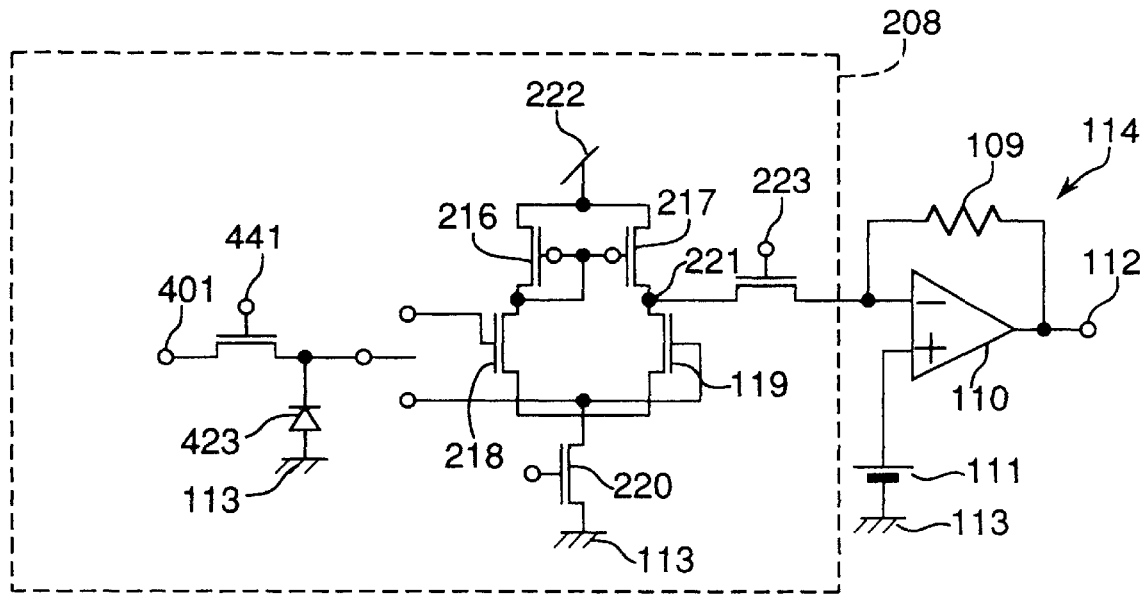
FIG. 15 is a circuit diagram of a photodetection circuit of a fifteenth embodiment of the invention.

FIG. 15 shows a photodetection circuit 908 of a fifteenth embodiment of the invention. In the photodetection circuit 908, an output from the photodetector 423 is entered through the switch 848 to the differential amplifier used in the circuit shown in FIG. 9. That is, the switch 848 is selected to connect the photodetector 423 to one of the gates of the transistors 218 and 219.

Next, the operation of the photodetection circuit 908 is explained. By turning on the switching transistor 430, the photodetector 423 is biased through the bias terminal 401, while the switch is set in a high impedance state. After charges are accumulated by radiation in the photodetector 423, they enter the gate of the transistor 218 or 219. Therefore, the output of the photodetector is amplified by the differential amplifier, and S/N ratio can be improved.

Figure 16:
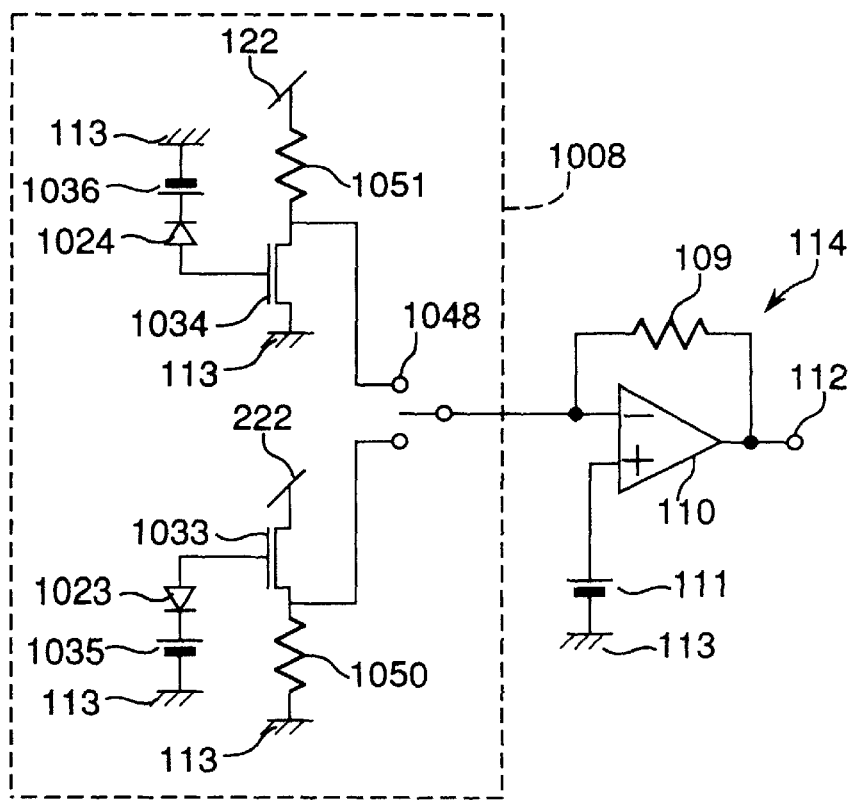
FIG. 16 is a circuit diagram of a photodetection circuit of a sixteenth embodiment of the invention.

FIG. 16 shows a photodetection circuit 1008 of a sixteenth embodiment of the invention. The circuit 508 has photodetectors 1023 and 1024 having an ordinary pn junction formed in a silicon substrate. The two photodetectors 1023 and 1024 are biased by the bias voltage sources 1035 and 1036 to the ground, while they are connected to gates of nMOS transistors 1033 and 1034, respectively. The transistor 1033 is connected through a resistor 1050 to the ground 113 and directly to the voltage power source 122, while the transistor 1034 is connected through a resistor 1051 to the voltage power source 122 and directly to the ground. The output voltages of the resistors 1050 and 1051 are supplied to the photodetectors 1023 and 1024, while they are also supplied through a tri-state switch 1048 to the external circuit 114.

Next, the operation of the photodetection circuit 908 is explained. The outputs of the two photodetectors 1023 and 1024 are input to the gates of the nMOS transistors 1033 and 1034. The drain current of the nMOS transistors 1033 and 1034 are controlled by modulation voltage from the photodetectors 1033 and 1034 to detect light. The drain voltage is taken out through the resistor 1050 and 1051. The tri-state switch 1048 is kept at a high impedance state except situations the output voltage of the resistor 1050 and 1051 is supplied to the external circuit 114. The switch 1048 can determine the direction of the current and control the direction effectively.

In the above-mentioned photodetection circuit 1008, nMOS transistors 1050 and 1051 are used. However, other elements such as pMOS transistors, analog switches, bipolar transistors, junction transistors, metal-semiconductor-contact type transistors or static induction transistors may also be used similarly. The resistors 1050 and 1051 may be replaced with metal oxide semiconductor field effect transistor (MOSFET) to be operated in a linear region.

Figure 17:
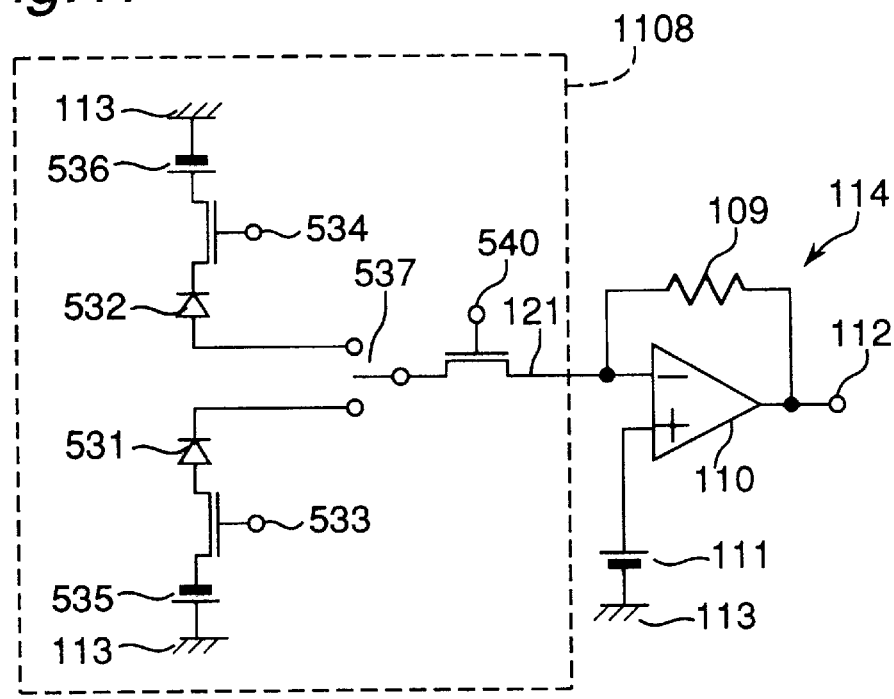
FIG. 17 is a circuit diagram of a photodetection circuit of a seventeenth embodiment of the invention.

FIG. 17 shows a photodetection circuit 1108 of a seventeenth embodiment of the invention. The circuit 1108 is the same as that shown in FIG. 11 except that the capacitor 518 and the transistor 539 are omitted. As explained above, the direction of the current flowing from the photodetectors 531 and 532 is different from each other. The polarity can be controlled by selecting one of the photodetectors 531 and 532 by the switch 537.

In the circuit 1008 shown in FIG. 16, the sensitivity can be controlled better if a capacitor and a reset switch therefor are provided before or after the switch 537, similarly to the circuit shown in FIG. 11.

Figure 18:
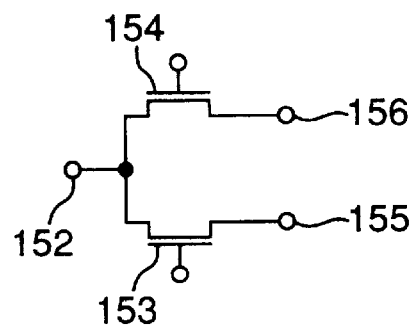
FIG. 18 is a circuit diagram of a modified example of a tri-state switch.
Figure 19:
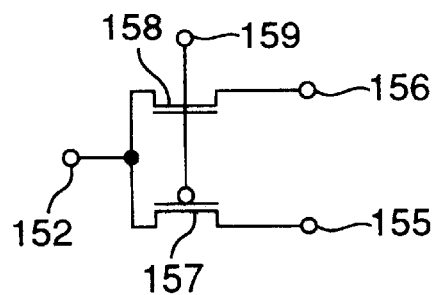
FIG. 19 is a circuit diagram of another modified example of a tri-state switch.

In the photodetector circuits shown in FIGS. 11–17, the tri-state switches 537, 637, 848, 1048 may be replaced with switches shown in FIGS. 18 and 19. In the switch shown in FIG. 18, nMOS transistors 153 and 154 are connected to each other at one ends 152, whole the other ends 155 and 156 thereof are separated from each other. The three ends 152, 155 and 156 act as three terminals of a tri-state switch. Then, this circuit is operated as a tri-state switch by turning on or off the transistors 153, 154.

In the switch shown in FIG. 19, a pMOS transistor 158 and an nMOS transistor 19 are connected to each other at one ends 152, whole the other ends 155 and 156 thereof are separated from each other. The three ends 152, 155 and 156 act as three terminals of a tri-state switch. Then, this circuit is operated as a tri-state switch by turning on or off the transistors 157, 158 by using a single control line 159.

In the above-mentioned photodetection circuits 108–1108, photodetectors 100, 423, 531, 532, 1023 and 1024 have pn junctions. However, they may be replaced by photodetectors comprising a MOS junction, Schottky junction, amorphous materials, photoconducting materials, thermoelectric materials, or quantum well levels or a combination thereof. Further, a material other than silicon such as III-V compound semiconductor, a II-V compound semiconductor, germanium or a combination thereof with silicon can be used as a material for a substrate. In the above-mentioned circuits, the external circuit 114 connected to the photodetection circuits is a trans-impedance type amplifier. However, the signal may be transferred like a charge-coupled device. Another external circuit may also be connected to the photodetector circuits.

Figure 20:
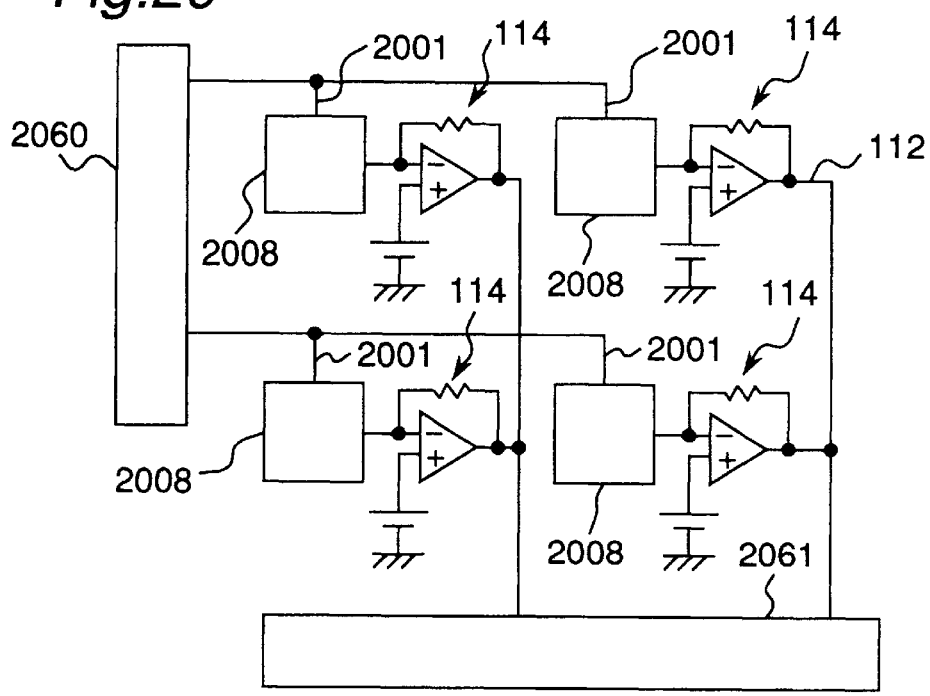
FIG. 20 is a block diagram of a photodetector array.

FIG. 20 shows a block diagram of a two-dimensional photodetector array. The array comprises four photodetectors 2008 arranged as a 2*2 matrix. The photodetectors 2008 are, for example, the photodetectors 108–1008 described above. A controller 2060 applies bias voltages to a bias terminal 2001 of each photodetector 2008. The output signals from each of the photodetectors 2008 in a column through the external circuit 114 thereof are connected commonly to an output circuit 2061.

Next, the operation of the photodetector array is explained. First, bias voltages for each row of the matrix are supplied by the controller 2060 to the photodetection circuits 2008. The signals detected by the photodetection circuits 2008 by controlling the sensitivity and the polarity are summed for each column. Thus, picture matrix or data for picture processing can be obtained. Because the sensitivity and the polarity can be for each photodetection circuit 2008, the precision of the data is improved, and data after desired processing can be provided to a picture processing apparatus.

Figure 21:
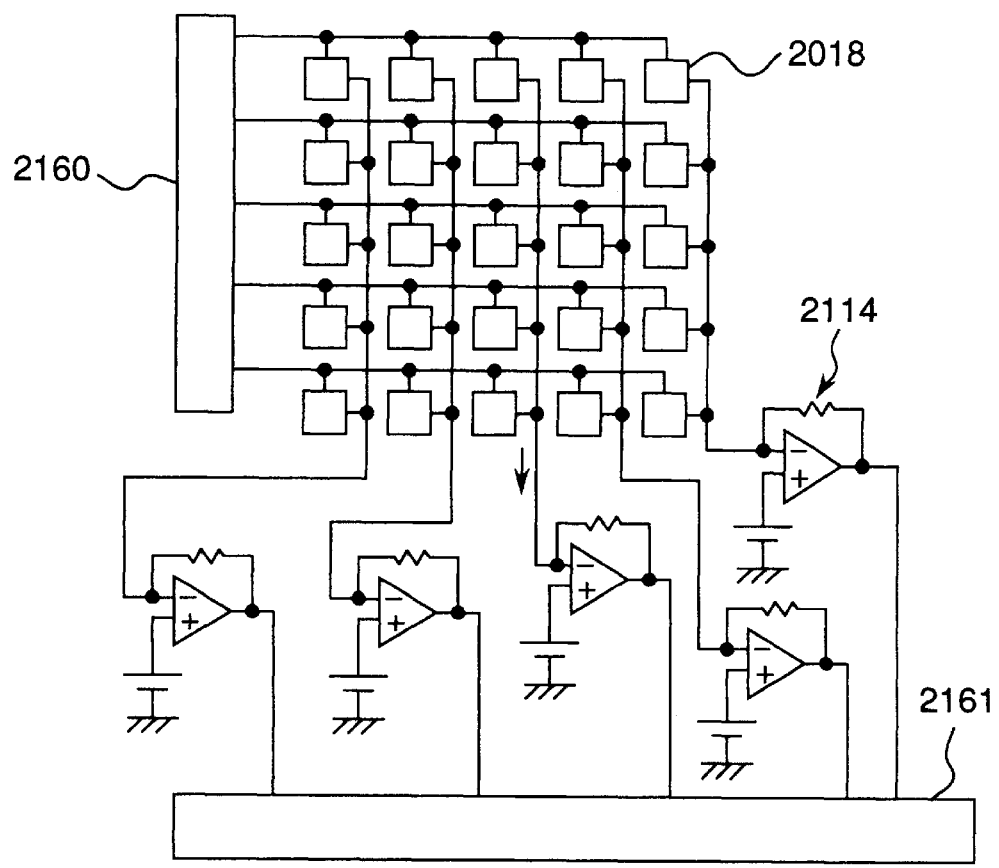
FIG. 21 is a block diagram of another photodetector array.

FIG. 21 shows a modified example of the photodetector array. the two-dimensional array comprises 25 photodetectors 2008 arranged as a 5*5 matrix. The photodetectors 2008 are, for example, the photodetectors 108–1008 described above. A controller 2160 applies bias voltages to a bias terminal 2001 of each photodetector 2008. The output signals from each of the photodetectors 2008 in a column are connected commonly to an external circuit 2114 to an output circuit 2161. As will be understood easily by a person skilled in the art, the size of the matrix shown in FIGS. 20 and 21 can be changed to a desired size.

In the above-mentioned photodetector arrays, variable sensitivity photodetector devices shown in FIGS. 1–6 can be used as the photodetectors 2008. Therefore, the array can detect a picture at a fast speed with a high precision.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A photodetector device which outputs an electric signal in correspondence to incident light, the device comprising:
   a semiconductor substrate having an upper surface;
   a first region of a first conduction type formed in said semiconductor substrate;
   second and third regions formed in said first region, each having a second conduction type opposite to the first conduction type and forming a pn junction with said first region, wherein said second and third regions each have side and bottom surfaces that are in direct contact with said first region to form PN junctions; and first and second electrodes formed at the upper surface of the substrate on said second and third regions, said first electrode connected to a first source potential and said second electrode connected to a second source potential different from said first source potential.

2. The device according to claim 1, wherein said photodetector device has a symmetrical structure on the positions of said second and third regions in said first region.

3. The device according to claim 1, wherein said substrate is made from silicon.

4. A photodetector device which outputs an electric signal in correspondence to incident light, the device comprising:
a semiconductor substrate having an upper surface;
a first region of a first conduction type formed in said semiconductor substrate;
second and third regions formed in said first region, each having a second conduction type opposite to the first conduction type and forming a pn junction with said first region;
first and second electrodes formed at the upper surface of the substrate on said second and third regions said first electrode connected to a first source potential and said second electrode connected to a second source potential; and
a control means for controlling the sensitivity of the device, the means being provided on said first region between said second and third regions.

5. The device according to claim 4, wherein said control means comprises an insulating film formed on said first region, and an electrode formed on said insulating film.

6. The device according to claim 4, wherein said control means comprises a fourth region formed in said first region between said second and third regions and forming a pn junction with said first region, and an electrode formed on said fourth region.

7. The device according to claim 4, wherein said substrate is made from silicon.

8. A photosensitive device which outputs an electric signal in correspondence to incident light, the device comprising:
a semiconductor substrate;
a first region formed in said semiconductor substrate;
second and third regions formed in said first region, each forming a pn junction with said first region;
first and second electrodes formed on said second and third regions;
first and second oxide layers formed on said first region between said second and third regions; and
first and second metallic layers formed on said first and second oxide layers.

9. The device according to claim 8, further comprising a control means for controlling the sensitivity of the device, the means being provided on said first region between said first and second oxide layers.

10. The device according to claim 9, wherein said control means comprises a third oxide layer formed on said first region, and a third metallic layer formed on said oxide layer.

11. The device according to claim 9, wherein said control means comprises a fourth region formed in said first region between said first and second regions and forming a pn junction with said first region, and an electrode formed on said fourth region.

12. The device according to claim 8, wherein said photodetector device has a symmetrical structure on the positions of said second and third regions in said first region.

13. The photosensitive device according to claim 8, wherein said substrate is made from silicon.

14. A photodetection circuit comprising:
a bias circuit for supplying a bias voltage;
a photodetector device which generates an electric signal in correspondence to charges associated with incident light under the bias voltage; and
an output circuit for supplying the charges;
wherein said photodetector device comprises
a semiconductor substrate having an upper surface;
a first region of a first conduction type formed in said semiconductor substrate;
second and third regions formed in said first region, each having a second conduction type opposite to the first conduction type and forming a pn junction with said first region, wherein said second and third regions each have side and bottom surfaces that are in direct contact with said first region to form PN junctions; and
first and second electrodes formed at the upper surface of the substrate on said second and third regions, said first electrode connected to a first source potential and said second electrode connected to a second source potential different from said first source potential,
wherein said bias circuit can change the polarity of the bias voltage applied to said photodetector device.

15. The photodetection circuit according to claim 14, further comprising a differential amplifier provided between said photodetector device and said output circuit, said differential amplifier amplifies a difference voltage between two terminals of said photodetector device.

16. The photodetection circuit according to claim 14, further comprising a polarity change circuit provided between said photodetector device and said output circuit.

17. The photodetection circuit according to claim 16, wherein said polarity change circuit comprises a switching element which outputs a voltage according to a voltage due to the charges stored in said photodetector device.

18. A photodetection circuit comprising:
a bias circuit for supplying a bias voltage;
a photodetector device which generates an electric signal in correspondence to charges associated with incident light under the bias voltage;
an output circuit for supplying the charges; and
wherein said photodetector device comprises
a semiconductor substrate having an upper surface;
a first region of a first conduction type formed in said semiconductor substrate;
second and third regions formed in said first region, each having a second conduction type opposite to the first conduction type and forming a pn junction with said first region, wherein said second and third regions each have side and bottom surfaces that are in direct contact with said first region to form PN junctions; and
first and second electrodes formed at the upper surface of the substrate on said second and third regions, said first electrode connected to a first source potential and said second electrode connected to a second source potential different from said first source potential;
a transimpedance circuit which changes the polarity of a current due to the charges based upon whether an output voltage of said output circuit is larger than a reference voltage or not;

wherein said bias circuit can change the polarity of the bias voltage applied to said photodetector device.

19. A photodetection circuit comprising:
a bias circuit for supplying a bias voltage;
a photodetector device which generates an electric signal in correspondence to charges associated with incident light under the bias voltage;
an output circuit for supplying the charges; and
wherein said photodetector device comprises
  a semiconductor substrate having an upper surface;
  a first region of a first conduction type formed in said semiconductor substrate;
  second and third regions formed in said first region, each having a second conduction type opposite to the first conduction type and forming a pn junction with said first region; and
  first and second electrodes formed at the upper surface of the substrate on said second and third regions, said first electrode connected to a first source potential and said second electrode connected to a second source potential different from said first source potential;
a holding circuit provided between said photodetector device and said output circuit, said holding circuit holding charges flown from said photodetector circuit,
wherein said bias circuit can change the polarity of the bias voltage applied to said photodetector device.

20. The photodetection circuit according to claim 19, wherein said holding circuit comprises a capacitor for storing the charges.

21. The photodetection circuit according to claim 19, wherein said holding circuit comprises two capacitors for storing the charges, said two capacitors are arranged in said holding circuit so that a current of different polarity from each other can be supplied to said output circuit.

22. The photodetection circuit according to claim 19, further comprising a polarity change circuit provided between said photodetector device and said output circuit.

23. The photodetection circuit according to claim 22, wherein said polarity change circuit comprises a transimpedance circuit which changes the polarity of a current due to the charges based upon whether an output voltage of said output circuit is larger than a reference voltage.

24. The photodetection circuit according to claim 22, wherein said polarity change circuit comprises a switching element which outputs a voltage according to a voltage due to the charges stored in said photodetector device.

25. A photodetection circuit comprising:
a bias circuit for supplying a bias voltage;
a photodetector device which generates an electric signal in correspondence to charges associated with incident light under the bias voltage;
an output circuit for supplying the charges; and
wherein said photodetector device comprises
  a semiconductor substrate having an upper surface;
  a first region of a first conduction type formed in said semiconductor substrate;
  second and third regions formed in said first region, each having a second conduction type opposite to the first conduction type and forming a pn junction with said first region; and
  first and second electrodes formed at the upper surface of the substrate on said second and third regions, said first electrode connected to a first source potential and said second electrode connected to a second source potential different from said first source potential;
a polarity change circuit provided between said photodetector device and said output circuit,
wherein said polarity change circuit comprises a transimpedance circuit which changes the polarity of a current due to the charges based upon whether an output circuit is larger than a reference voltage,
wherein said bias circuit can change the polarity of the bias voltage applied to said photodetector device.

26. A photodetector device which outputs an electric signal in correspondence to incident light, the device comprising:
a semiconductor substrate;
a first region of a first conduction type formed in said semiconductor substrate;
second and third regions formed in said first region, each having a second conduction type opposite to the first conduction type and forming a pn junction with said first region;
first and second electrodes formed on said second and third regions; and
a control means for controlling the sensitivity of the device, the means being provided on said first region between said second and third regions,
wherein said control means comprises a fourth region formed in said first region between said second and third regions and forming a pn junction with said first region, and an electrode formed on said fourth region.

* * * * *